United States Patent
Nakao et al.

(10) Patent No.: US 8,197,600 B2
(45) Date of Patent: Jun. 12, 2012

(54) VAPORIZER AND SEMICONDUCTOR PROCESSING SYSTEM

(75) Inventors: Ken Nakao, Nirasaki (JP); Hitoshi Kato, Oshu (JP); Tsuneyuki Okabe, Oshu (JP); Shigeyuki Okura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1118 days.

(21) Appl. No.: 12/076,765

(22) Filed: Mar. 21, 2008

(65) Prior Publication Data

US 2008/0245306 A1 Oct. 9, 2008

(30) Foreign Application Priority Data

Mar. 29, 2007 (JP) .................. 2007-087757

(51) Int. Cl.
*C23C 16/00* (2006.01)
*C23C 16/448* (2006.01)
(52) U.S. Cl. .................. 118/726; 261/78.1; 261/78.2
(58) Field of Classification Search .............. 118/726; 261/78.1, 78.2
See application file for complete search history.

(56) References Cited

U.S. PATENT DOCUMENTS

| | | | |
|---|---|---|---|
| 6,174,371 B1 * | 1/2001 | Iseki et al. | 118/689 |
| 6,296,894 B1 * | 10/2001 | Tanabe et al. | 427/8 |
| 6,473,563 B2 | 10/2002 | Takamatsu et al. | |
| 6,885,814 B2 * | 4/2005 | Saito et al. | 392/407 |
| 7,452,424 B2 | 11/2008 | Okabe et al. | |
| 7,883,076 B2 * | 2/2011 | Okabe et al. | 261/142 |
| 2003/0209201 A1 * | 11/2003 | Takamatsu et al. | 118/726 |
| 2004/0216669 A1 | 11/2004 | Takamatsu et al. | |
| 2006/0065254 A1 * | 3/2006 | Okabe et al. | 123/557 |
| 2007/0079760 A1 * | 4/2007 | Okabe et al. | 118/715 |
| 2007/0108641 A1 * | 5/2007 | Okabe et al. | 261/118 |
| 2008/0245306 A1 * | 10/2008 | Nakao et al. | 118/726 |
| 2009/0186479 A1 * | 7/2009 | Okabe et al. | 438/680 |

FOREIGN PATENT DOCUMENTS

| | | |
|---|---|---|
| CN | 1454029 A | 11/2003 |
| CN | 1542918 A | 11/2004 |
| CN | 1754983 A | 4/2006 |
| JP | 3-126872 | 5/1991 |
| JP | 2000-21890 | 1/2000 |
| JP | 2002-334867 | 11/2002 |

(Continued)

OTHER PUBLICATIONS

Chinese Office Action issued on Oct. 21, 2010 for Chinese Application No. 200810086915.3 with English translation.

(Continued)

*Primary Examiner* — Jeffrie R Lund
(74) *Attorney, Agent, or Firm* — Smith, Gambrell & Russell, LLP

(57) ABSTRACT

A vaporizer for generating a process gas from a liquid material includes a heat-exchange lower block having a hollow internal space and disposed below the spray port of an injector inside the container. A run-up space for the atomized liquid material is defined between the spray port and the heat-exchange lower block, and an annular space continuous to the run-up space is defined between an inner surface of the container and the heat-exchange lower block. An internal heater is disposed in the internal space of the heat-exchange lower block and includes a carbon wire formed of woven bundles of carbon fibers and sealed in a ceramic envelope. The internal heater is configured to heat the atomized liquid material flowing through the annular space to generate the process gas.

19 Claims, 6 Drawing Sheets

FOREIGN PATENT DOCUMENTS

| | | |
|---|---|---|
| JP | 2003-13234 | 1/2003 |
| JP | 2004-211183 | 7/2004 |
| KR | 2002-0043163 | 6/2002 |
| KR | 2003-0093312 | 12/2003 |

OTHER PUBLICATIONS

Korean Office Action mailed on Aug. 10, 2011 for Application No. 10-2008-0028805 with English translation.

* cited by examiner

VAPORIZER AND SEMICONDUCTOR PROCESSING SYSTEM

BACKGROUND OF THE INVENTION

1. Field of the Invention

The present invention relates to a vaporizer for generating a process gas from a liquid material, and a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

A film formation process for forming a predetermined film on the surface of a semiconductor wafer is performed in manufacturing semiconductor devices. For example, a process of this kind is performed, using a low-pressure CVD (Chemical Vapor Deposition) apparatus. In low-pressure CVD apparatuses, a source material is supplied in a gaseous state to promote a chemical reaction, thereby depositing a thin film on the surface of a wafer. In apparatuses of this kind, there is a case where a process gas is generated by vaporizing a liquid material, and is supplied into a process chamber as a film formation gas.

Examples of a film formation process using a process gas generated by vaporizing a liquid material are as follows. Specifically, a process gas generated by vaporizing TEOS (tetraethoxysilane) and oxygen ($O_2$) gas are used to form an $SiO_2$ film. A process gas generated by vaporizing $Si_2Cl_6$ and ammonia ($NH_3$) gas are used to form a silicon nitride ($Si_3N_4$) film.

Patent Document 1 (Jpn. Pat. Appln. KOKAI Publication No. 3-126872 (Page 3, Paragraph number 30, and FIG. 1)) discloses one type of a vaporizer for vaporizing a liquid material. According to this vaporizer, an atomized liquid material is supplied from a nebulizer into a vaporizing chamber heated at a predetermined temperature, and is vaporized there. However, this vaporizer cannot provide a sufficient heat exchange when the atomized liquid material flows through the vaporizing chamber. Consequently, the process gas obtained at the output pipe of the vaporizing chamber contains a lot of mist. Where the process gas is supplied into the reaction chamber of, e.g., a low-pressure CVD apparatus, the mist is deposited on the surface of a wafer and generates particles. Hence, the mist is a cause of particle generation on the wafer.

In light of the problem described above, the research group including the present inventors has developed a vaporizer 300 shown in FIG. 6. The vaporizer 300 includes a vaporizing chamber 302 provided with sidewall heaters 301 and a heat-exchange lower block 303 disposed inside the vaporizing chamber 302 on the bottom. The heat-exchange lower block 303 is also provided with, e.g., four rod-like heaters 304 embedded therein at intervals in an annular direction to vaporize a liquid material on the surface of the heat-exchange lower block 303. The heaters 301 and 304 are connected to a power supply section 310. An injector 305 is disposed at the top of the vaporizing chamber 302 and is configured to supply the liquid material in an atomized state into the vaporizing chamber 302. The liquid material is heated to, e.g., 150° C. and thereby vaporized by the sidewall heaters 301 of the vaporizing chamber 302 and the heaters 304 of the heat-exchange lower block 303. The liquid material thus vaporized is supplied as a process gas from the output port 306 to a consuming apparatus, such as a CVD apparatus.

However, the present inventors have found that this vaporizer entails a problem, as described later.

BRIEF SUMMARY OF THE INVENTION

An object of the present invention is to provide a vaporizer that can vaporize a liquid material with high efficiency and suppress particle generation. Another object of the present invention is to provide a semiconductor processing system that can perform a process with high efficiency.

According to a first aspect of the present invention, there is provided a vaporizer for generating a process gas from a liquid material, the vaporizer comprising: a container defining a process space of the vaporizer; an injector having a spray port configured to spray the liquid material in an atomized state downward in the container; a heat-exchange lower block having a hollow internal space and disposed below the spray port inside the container such that a run-up space for the atomized liquid material is defined between the spray port and the heat-exchange lower block, and an annular space continuous to the run-up space is defined between an inner surface of the container and the heat-exchange lower block; an internal heater disposed in the internal space of the heat-exchange lower block and comprising a carbon wire formed of woven bundles of carbon fibers and sealed in a ceramic envelope, the internal heater being configured to heat the atomized liquid material flowing through the annular space to generate the process gas; a gas delivery passage connected to the container to output the process gas from the annular space; and a control section preset to stop or decrease an electric power supplied to the internal heater when supply of the liquid material from the injector is stopped.

According to a second aspect of the present invention, there is provided a semiconductor processing system comprising: a process chamber configured to accommodate a target substrate; a support member configured to support the target substrate inside the process chamber; a heater configured to heat the target substrate inside the process chamber; an exhaust system configured to exhaust gas from inside the process chamber; and a gas supply system configured to supply a process gas into the process chamber, and including a vaporizer for generating the process gas from a liquid material, wherein the vaporizer comprises a container defining a process space of the vaporizer, an injector having a spray port configured to spray the liquid material in an atomized state downward in the container, a heat-exchange lower block having a hollow internal space and disposed below the spray port inside the container such that a run-up space for the atomized liquid material is defined between the spray port and the heat-exchange lower block, and an annular space continuous to the run-up space is defined between an inner surface of the container and the heat-exchange lower block, an internal heater disposed in the internal space of the heat-exchange lower block and comprising a carbon wire formed of woven bundles of carbon fibers and sealed in a ceramic envelope, the internal heater being configured to heat the atomized liquid material flowing through the annular space to generate the process gas, a gas delivery passage connected to the container to output the process gas from the annular space, and a control section preset to stop or decrease an electric power supplied to the internal heater when supply of the liquid material from the injector is stopped.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 6:
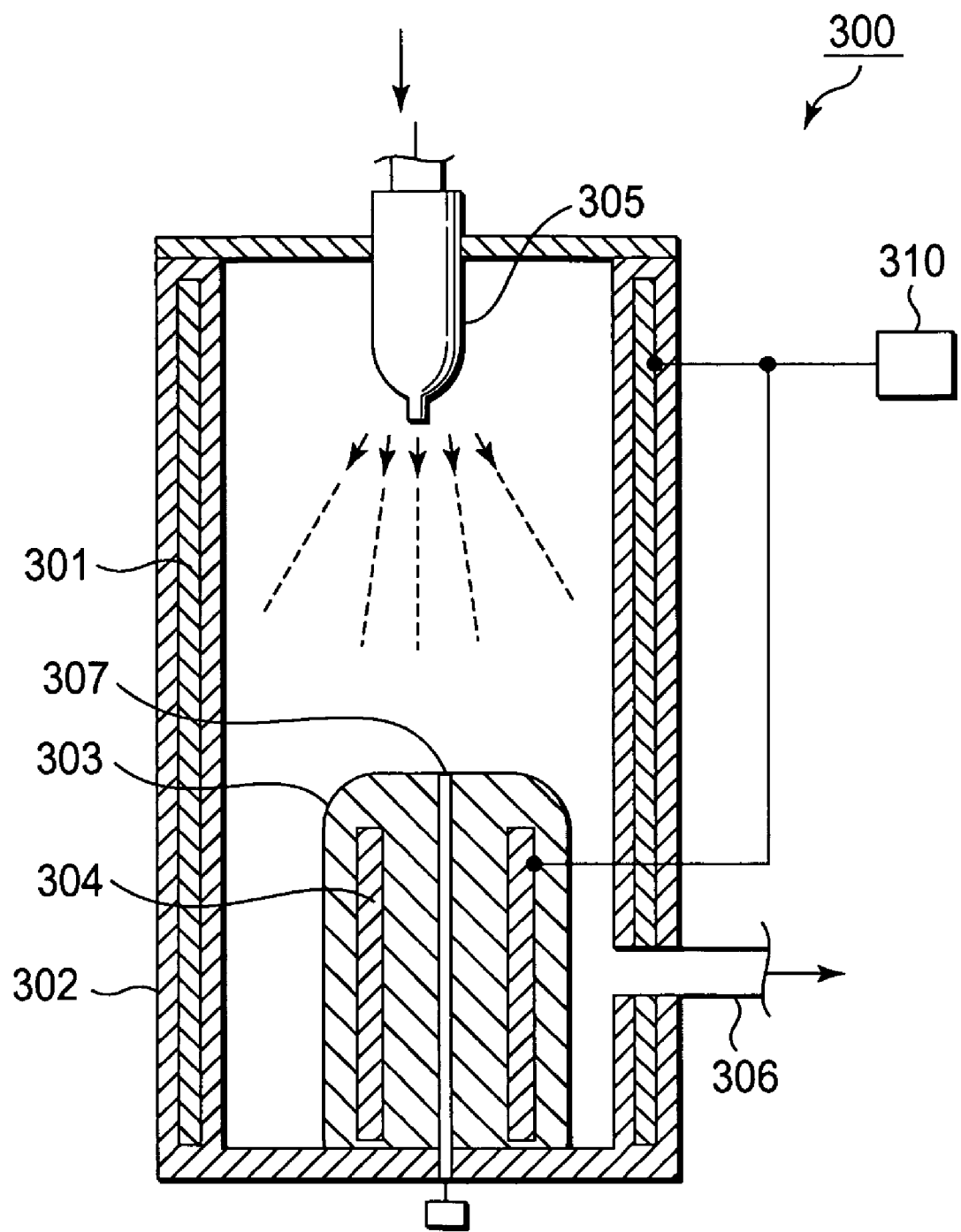
FIG. 6 is a sectional side view showing a vaporizer provided with a heat-exchange lower block having a solid-core structure.

In the process of developing the present invention, the inventors studied problems of the vaporizer shown in FIG. 6. As a result, the inventors have arrived at the findings given below.

In the vaporizer 300 shown in FIG. 6, the atomized liquid material is vaporized the most on the upper surface of the heat-exchange lower block 303, so the temperature of the upper surface is cooled by the vaporization heat. In light of this, the upper surface of the heat-exchange lower block 303 is provided with a temperature sensor 307, such as a thermocouple, so that the output of the heaters 304 is adjusted to set the upper surface at a temperature higher than the vaporizing point of the liquid material. Consequently, a temperature gradient is formed inside the heat-exchange lower block 303, such that the temperature is gradually higher toward the central portion.

According to the vaporizer 300, mist of the liquid material is heated by the heat-exchange lower block 303 as well as the sidewall of the vaporizing chamber 302. This arrangement can increase the amount of mist vaporized and thus decrease the amount of mist contained in the process gas supplied to a CVD apparatus or the like, thereby suppressing particle generation.

In operation, the heat-exchange lower block 303 is in a thermal storage state at high temperature, while it discharges heat by vaporization of the atomized liquid material. However, when supply of the liquid material is stopped, the heat-exchange lower block 303 loses the target for heat discharge. When supply of the liquid material is stopped, even if heating of the heat-exchange lower block 303 is stopped at the same time, the heat-exchange lower block 303 lapses into a so-called overshoot state that rapidly increases the temperature of the surface, because the heat-exchange lower block 303 has a large thermal capacity. In general, liquid materials, such as organic metal complexes, have their own narrow temperature ranges suitable for vaporization, and most of them may denature and generate residues due to thermal decomposition when used at a temperature above the temperature ranges. Accordingly, in the vaporizer 300, when the heat-exchange lower block 303 is overheated, the liquid material may denature and generate residues due to thermal decomposition. In this case, the residues are deposited inside the vaporizing chamber 302 and/or process gas supply passage. In a subsequent process, the deposited residues are partly peeled off and mixed in the process atmosphere, and thereby bring about ill effects, such as particle contamination. This overshoot problem is also cased in a vaporizing chamber disclosed in Patent Document 1 described above.

As a method for solving this problem, a cooled purge gas, such as an inactive gas, which can scarcely affect the process, may be supplied into the vaporizing chamber 302 to cool the heat-exchange lower block 303, after supply of the liquid material is stopped and before the overshoot is caused. However, in this case, a large amount of purge gas needs to be supplied every time supply of the liquid material is stopped. This is unfavorable in cost, because of an increase in gas consumption as well as an increase in energy consumption due to cooling of the purge gas.

Further, as described above, the heaters 304 embedded in the heat-exchange lower block 303 is controlled, while the temperature of the upper surface of the heat-exchange lower block 303 is measured. However, the heaters 304 cannot uniformly heat the entire surface of the heat-exchange lower block 303. Where the temperature control of the heat-exchange lower block 303 is performed in accordance with the temperature of the upper surface, which is the lowest, the temperature at the bottom becomes too high. In other words, a temperature gradient is formed on the surface of the heat-exchange lower block 303 such that the temperature is gradually higher from the upper side to the lower side. For example, the temperature of the heat-exchange lower block 303 at the bottom is increase to about 350° C. This may cause decomposition due to overheat of the liquid material, and further cause thermal degradation of a member, such as a resin O-ring (not shown), disposed between the bottom and sidewall of the vaporizing chamber 302.

The overshoot and temperature gradient in the vertical direction of the heat-exchange lower block 303 described above is more prominent with an increase in the flow rate of a process gas (i.e., an increase in the flow rate of the liquid material). Accordingly, where a process requires a larger flow rate, the problem described above becomes more serious. The thermal degradation of a seal member described above may be caused not only in a case where a thermally decomposable material is used as a liquid material, but also in a case where water is used for the process.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 1:
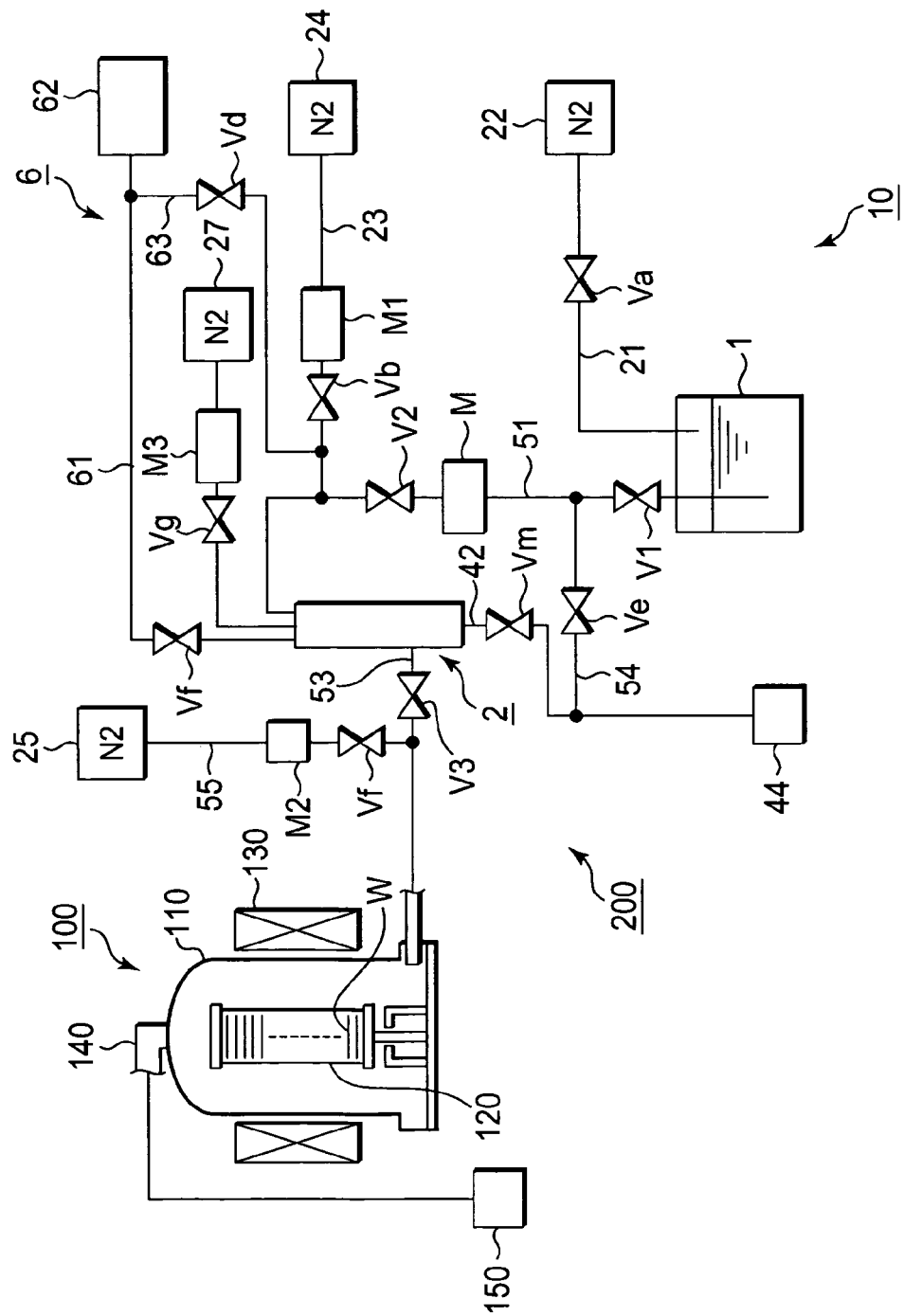
FIG. 1 is a structural view showing a semiconductor processing system (film formation system) according to an embodiment of the present invention.

FIG. 1 is a structural view showing a semiconductor processing system (film formation system) according to an embodiment of the present invention. As shown in FIG. 1, this system 10 includes a film formation section configured to perform a predetermined film formation process on target substrates, such as wafers W, (to form a predetermined thin film on the wafers W). The film formation section 100 is connected to a gas supply system 200 configured to supply a predetermined process gas.

For example, the film formation section 100 comprises a low-pressure CVD apparatus of the batch type having a vertical reaction tube 110 used as a reaction chamber (process chamber). A wafer boat 120 that supports a number of wafers W can be loaded and unloaded into and from the reaction tube 110. A heater 130 is disposed around the reaction tube 110 to heat the wafers W. A vacuum pump 150 used as vacuum exhaust means is disposed to maintain the interior of the reaction tube 110 at a predetermined vacuum level. A predetermined process gas is supplied into the reaction tube 110 through a process gas supply line 53, as described later.

The gas supply system 200 includes a storage vessel 1, a vaporizer 2, and piping lines connected to them. The storage vessel 1 stores a liquid material having a low vapor pressure of, e.g., 0.55 Pa at 85° C., such as a hafnium-containing material, e.g., TEMAH (Tetrakis (N-ethyl-N-methylamino) hafnium) or HTB (hafnium tetra-t-butoxide). The vaporizer 2 is configured to vaporize the liquid material supplied from the storage vessel 1, so as to generate the process gas.

Specifically, the storage vessel 1 is connected to the vaporizer 2 through a supply line (liquid material supply passage) 51. The end of the supply line 51 at the storage vessel 1 is positioned in the liquid material within the storage vessel 1. The supply line 51 is provided with a first valve V1, a liquid mass flow meter M, and a second valve V2 in this order from the upstream side (from the storage vessel 1). The temperature of the liquid material flowing through the supply line 51 is set at, e.g., about 40° C. by a heater (not shown) disposed around the supply line 51.

An $N_2$ gas supply source 24 is connected to the supply line 51 downstream from the valve V2 through a gas supply line 23. The gas supply line 23 is provided with a first mass flow controller M1 and a valve Vb in this order from the gas supply source 24. With this arrangement, $N_2$ gas can be supplied to the supply line 51 at a predetermined flow rate.

A gas supply line 21 provided with a valve Va is connected to the storage vessel 1. One end of the gas supply line 21 is positioned above the surface of the liquid material within the storage vessel 1. The other end of the gas supply line 21 is connected to a supply source 22 of a pressurized gas, such as $N_2$ gas. When the liquid material is supplied from the storage vessel 1 to the vaporizer 2, the storage vessel 1 is supplied with $N_2$ gas in an amount of, e.g., about 1.0 kg/cm². The liquid material is sent and transported by the pressure from the storage vessel 1 to the vaporizer 2 at a predetermined flow rate. The pressurized gas may be an inactive gas, such as helium (He) gas or argon (Ar) gas other than $N_2$ gas.

Figure 2:
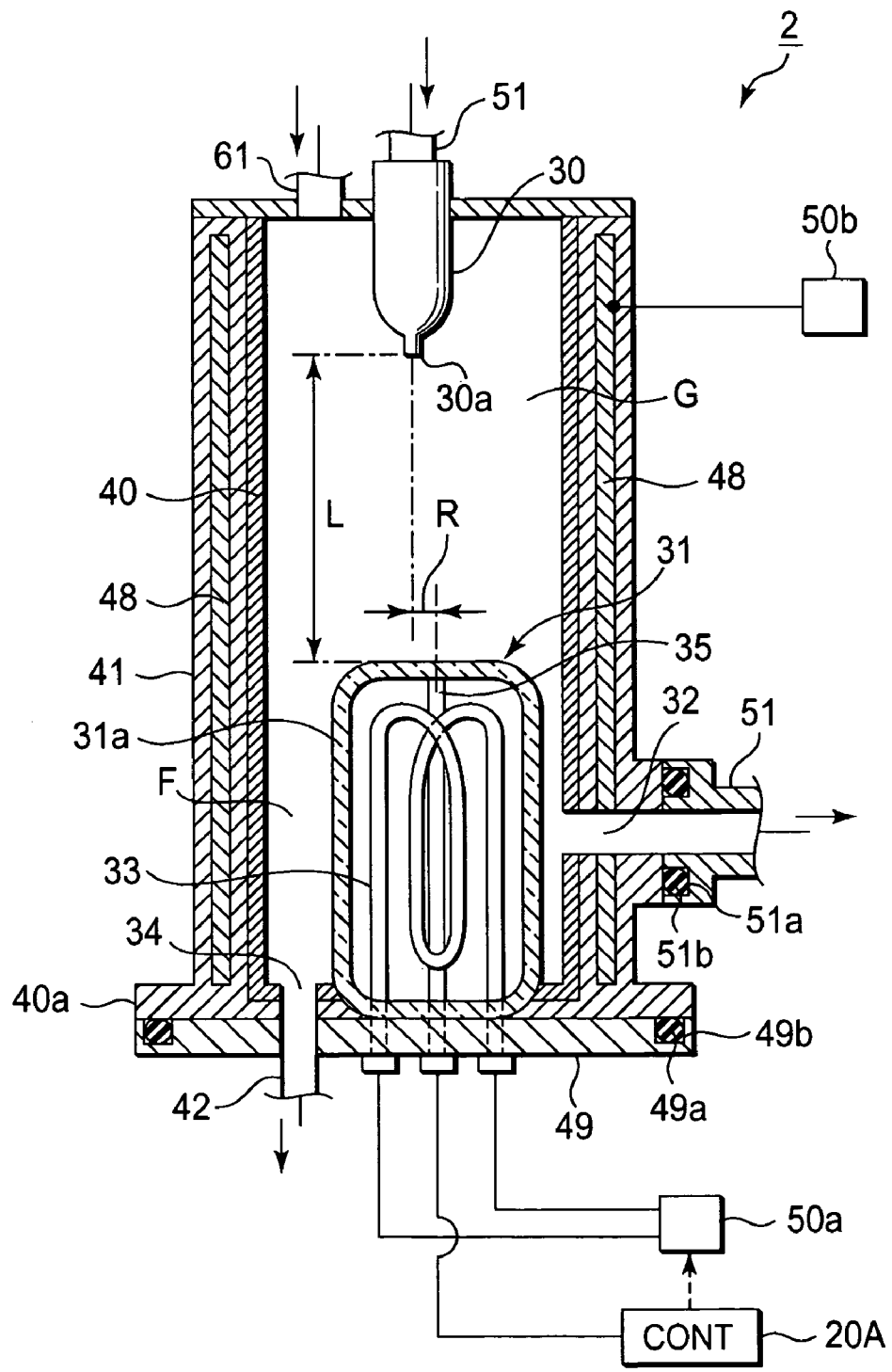
FIG. 2 is a sectional side view showing a vaporizer used in the system shown in FIG. 1.

FIG. 2 is a sectional side view showing the vaporizer 2 used in the system shown in FIG. 1. The vaporizer 2 includes a cylindrical airtight container 40 used as a unit body for defining a vaporizer process space, and a rectangular cover 41 covering the outer surface of the container 40. The container 40 is formed of a vertical cylinder of stainless steel, which has an inner diameter of 30 to 40 mm and a length of 250 mm, for example. An injector 30 is disposed on the central axis of the container 40 at the top, and is connected to the supply line 51. The injector 30 is of a spray-type having a double tube structure formed of inner and outer tubes. The inner tube discharges a liquid material supplied from the supply line 51, while the outer tube discharges nitrogen gas used as an atomizing gas supplied from an $N_2$ gas supply source 27 through a valve Vg and a mass flow controller M3. The liquid material is delivered into the container 40 from a spray port 30a (having a hole diameter of, e.g., 0.1 mm) at the distal end of the injector 30 in an atomized state (as mist).

A cylindrical heat-exchange lower block 31 having a smaller diameter than the container 40 is disposed on the bottom of the container 40. The heat-exchange lower block 31 comprises an airtight hollow casing 31a defining the outer contour and formed of a wall of a transparent material, such as quartz, with a small thickness. The wall thickness of the casing 31a is set to be 1 to 10 mm, and preferably to be 2 to 6 mm, such as about 3 mm. The atmosphere inside the casing 31a is set to have atmospheric pressure or a vacuum pressure. The casing 31a may be filled with an inactive gas, such as nitrogen gas.

A wire-like internal heater 33 formed of a carbon wire heater is disposed inside the casing 31a. The internal heater 33 includes a carbon wire formed of a high-purity flexible heating wire, such as woven bundles of carbon fibers, each of which has a diameter of about 10 μm. The carbon wire is sealed and fixed in a ceramic envelope, such as a transparent quartz tube having an outer diameter of, e.g., several tens mm. The internal heater 33 is connected to a power supply section 50a, and is configured to heat the inner surface of the heat-exchange lower block 31 and to heat the inner wall of the container 40 through the transparent casing 31a, both by radiant heat. A temperature sensor 35, such as a thermocouple, is disposed inside the casing 31a to measure the temperature at the top of the heat-exchange lower block 31. The power supply section 50a and temperature sensor 35 are connected to a control section 20A described later.

The casing 31a is preferably made of a transparent material to transmit radiant heat, emitted from the internal heater 33, to the outside of the heat-exchange lower block 31 (to the inner wall of the container 40 and mist of the liquid material flowing inside the container 40). This transparent material may be a material other than quartz, which transmits infrared rays, as long as the material can transmit radiant heat to the outside of the heat-exchange lower block 31. For example, the casing 31a may be made of a material that allows the casing 31a to once absorb radiant heat in the inner surface and then emit the heat as radiant heat from the outer surface. Further, the casing 31a may be made of a non-transparent material, such as stainless steel or SiC (silicon carbide).

A run-up space G is defined between the injector 30 and the heat-exchange lower block 31 and has a distance L to further uniformly atomize the atomized liquid material from the injector 30. The center of the heat-exchange lower block 31 is offset from the center of the injector 30 toward one side by a distance R of, e.g., 1 to 4 mm. On this side, as described later, an output port 32 is formed near the bottom of the container 40 to output the process gas from the vaporizer 2. With this arrangement, an annular space F is defined between the inner surface of the container 40 and the heat-exchange lower block 31. The width of the annular space F (the width shown in the plan view of the vaporizer 2) is arranged such that a width on the output port 32 side is smaller than a width on the side opposite thereto.

The cover 41 contains a plurality of heaters 48 formed of resistive heating bodies, which are disposed to extend in, e.g., the longitudinal direction of the container 40 and surround the container 40. In this embodiment, the heaters 48 consist of two heaters disposed near the output port 32 and two heaters disposed near the opposite side to the output port 32. These heaters 48 are respectively connected to a power supply section 50b. For example, the heaters 48 are controlled for heating by a common temperature controller. Alternatively, the heaters 48 may be controlled for heating such that a set of two heaters on the output port 32 side is controlled independently of a set of two heaters on the opposite side. Alternatively, the heaters 48 may be controlled for heating such that the four heaters are controlled independently of each other. As described later, the heaters 48 may be omitted, where the internal heater 33 inside the heat-exchange lower block 31 can sufficiently vaporize the liquid material.

The container 40 has the output port 32 formed in the sidewall near the bottom to output the process gas generated by vaporization of the liquid material. The output port 32 is connected to the supply line 51 described above. The output port 32 and supply line 51 are set in airtight contact with each other by bolts through a seal member, such as a resin O-ring 51*b*, fitted in a groove 51*a* formed on the end face of the supply line 51. The bottom of the container 40 is provided with a flange 40*a*, on which a lid 49 is connected in an airtight contact state through an O-ring 49*b* fitted in a groove 49*a* formed on the lid 49.

The container 40 further has a drain port 34 formed in the bottom to discharge non-vaporized part of the liquid material. In this embodiment, the drain port 34 is formed on the opposite side to the output port 32. The drain port 34 is connected to a discharge line 42, which is provided with a mist discharge valve Vm near the bottom of the container 40. When the valve Vm is closed, a mist receiver is formed near the drain port 34 to store mist. The other end of the discharge line 42 is connected to an exhaust pump 44 to suck and discharge mist, so a suction passage is defined by the discharge line 42 and exhaust pump 44.

A supply section 6 for supplying a cleaning solution into the container 40 is connected to the vaporizer 2 to clean up the interior of the container 40. The supply section 6 includes a cleaning solution vessel 62 for storing the cleaning solution, which is connected to the top of the container 40 through a supply line 61 provided with a valve Vc. The cleaning solution is a solvent, such as an alcohol family solution, e.g., ethanol or hexane, which dissolves the liquid material and solidified liquid material. The cleaning solution is supplied from the cleaning solution vessel 62 through the supply line 61 into the container 40. The cleaning solution is discharged through the discharge line 42 when the valve Vm is opened.

The vaporizer 2 is connected to the reaction tube 110 of the film formation section 100 through the supply line (process gas supply line) 53 provided with a third valve V3, as described later. In order to guide the process gas to the film formation section 100 while preventing it from condensing, the distance from the third valve V3 to the film formation section 100 is set to be short, such as about 50 to 100 cm. The temperature of the process gas flowing through the supply line 53 is set at, e.g., about 80° C. by a tape heater (not shown) disposed around the supply line 53.

For cleaning of the interior of the supply line 53, a nitrogen gas supply source 25 is connected to the supply line 53 downstream from the valve V3, through a supply line 55 provided with a valve Vf and a mass flow controller M2. For cleaning of the interior of the supply line 51, a branch line 63 provided with a valve Vd is connected at one end to the supply line 61, and at the other end to the gas supply line 23 between the valve Vb and vaporizer 2. Further, a branch line 54 provided with a valve Ve is connected at one end to the supply line 51 between the first valve V1 and liquid mass flow meter M, and at the other end to the discharge line 42 downstream from the valve Vm.

Further, the film formation system 10 includes a control section 20A, such as a computer, which also serves as a controller for the vaporizer 2. The control section 20A includes a data processing part formed of, e.g., CPU and a memory that stores programs and so forth. The programs contain instructions for the control section 20A to send control signals to the respective portions of the film formation system 10 including the vaporizer 2, so as to perform steps of processing and transferring wafers W, as described later. Further, the memory includes areas for storing process parameters, such as process pressures, process temperatures, process times, gas flow rates, and/or electric power values. Where the instructions of a program are executed by the CPU, required process parameters are retrieved, and control signals corresponding to parameter values are sent to the respective portions of the film formation system 10 including the vaporizer 2. The programs (including programs for input operations and display of process parameters) are stored in a computer readable storage medium, such as a flexible disk, compact disk, MO (magnetic optical disk), or hard disk, and are installed therefrom into the control section 20A.

Next, an explanation will be given of a film formation method performed in the film formation system 10 having the structure described above. At first, in the film formation section 100, a predetermined number of wafers W are placed on the boat 120. The boat 120 thus prepared is loaded into the reaction tube 110 set at a predetermined temperature, and the interior of the reaction tube 110 is vacuum-exhausted to a predetermined vacuum level. Then, the interior of the reaction tube 110 is stabilized at a predetermined temperature and a predetermined pressure.

On the other hand, in the gas supply system 200, the valves Vm, Vb, Vc, Vd, and Ve are set closed, and the valves V1, V2, V3, and Va are set open. Consequently, $N_2$ gas used as a pressurized gas is supplied from the gas supply source 22 into the storage vessel 1 through the gas supply line 21. With this pressurized gas being supplied, the liquid material having a low vapor pressure, such as hafnium-containing material, is sent by pressure from the storage vessel 1 through the supply line 51 to the vaporizer 2, at a flow rate controlled by the liquid mass flow meter M. Further, nitrogen gas is supplied from the nitrogen gas supply source to spray the liquid material from the injector 30 of the vaporizer 2. Consequently, along with this nitrogen gas, the liquid material in an atomized state is supplied into the vaporizer 2 at a flow rate of, e.g., 5 sccm.

Figure 3:
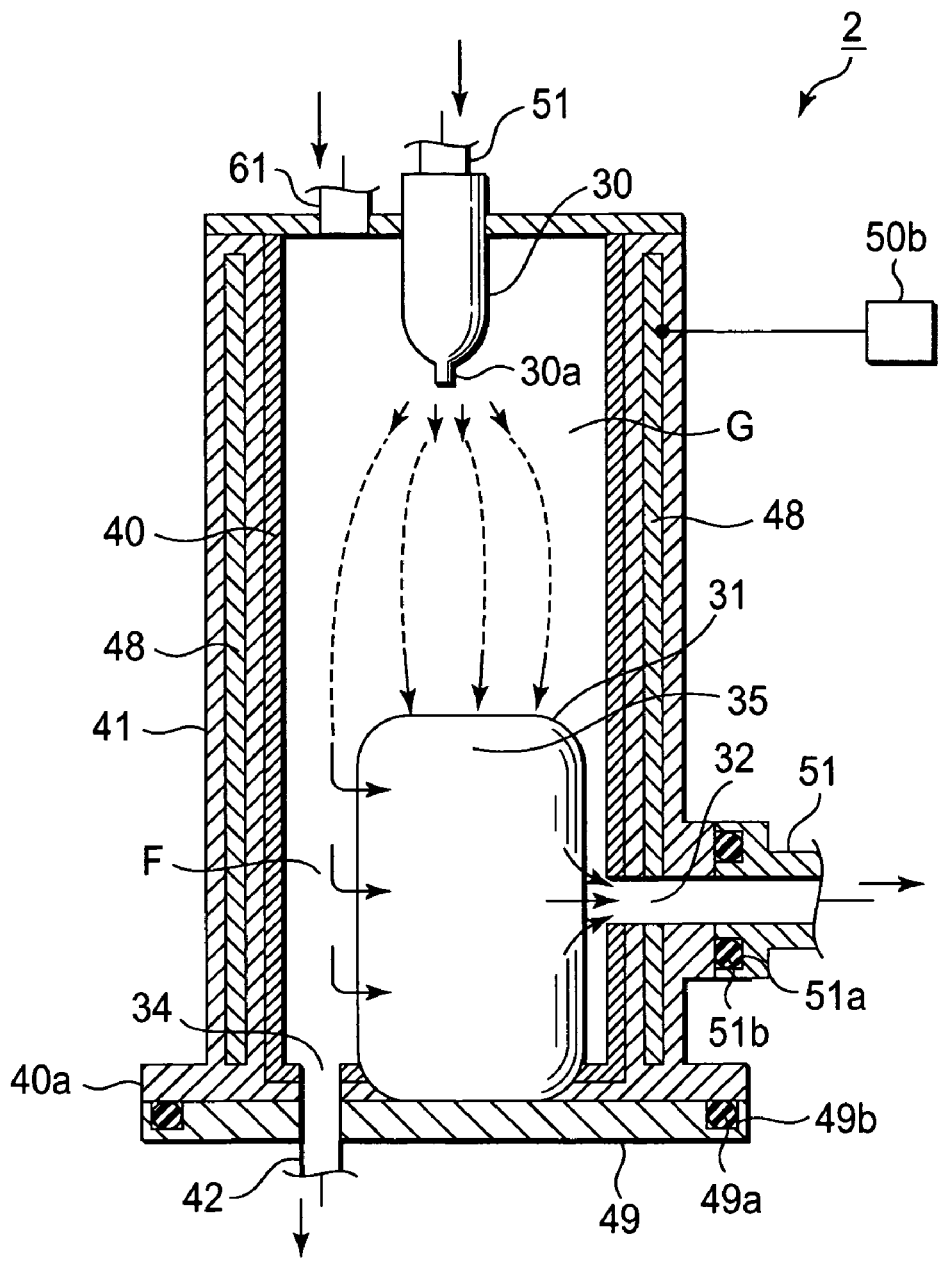
FIG. 3 is a view schematically showing an image of the gas flow inside the vaporizer shown in FIG. 2.

FIG. 3 is a view schematically showing an image of the gas flow inside the vaporizer shown in FIG. 2. In the vaporizer 2, the inner wall of the container 40 is heated to, e.g., 150° C. by the heaters 48. Further, the internal heater 33 is set at, e.g., 300° C., so that the top face of the heat-exchange lower block 31 is heated to, e.g., 150° C. At this time, the inner surface of the casing 31*a* is heated by radiant heat from the internal heater 33, and this heat is transmitted to the outside of the casing 31*a* (to the surface), so that the heat-exchange lower block 31 is uniformly heated to a temperature TA, e.g., about 150° C.

The internal space of the casing 31*a* is hollow and set to have an atmosphere of atmospheric pressure or a vacuum pressure, which can hardly cause any heat conduction or gas convection. In this case, the temperature difference on the heat-exchange lower block 31 can be very small in the vertical direction. Further, the heat-exchange lower block 31 has a small thermal capacity, and thus the heat stored therein is small. In addition, where heating is performed by radiant heat from the internal heater 33, the surface of the casing 31*a* is mainly heated, while the temperature of the atmosphere inside the casing 31*a* is not so increased. In this case, the surface of the casing 31*a* is preferentially heated, and the entire surface of the heat-exchange lower block 31 is thereby uniformly heated.

The casing 31a is made of transparent quartz, so radiant heat from the internal heater 33 also heats the inner wall of the container 40 through the casing 31a. Consequently, the interior of the container 40 is set at e.g., about 150° C. In this state, the liquid material is delivered downward from the injector 30 into the container 40 in an atomized state (as micro-particles). The atomized liquid material is further uniformly atomized and partly vaporized by heating, while it is spreading conically in the run-up space G defined at the upper side within the container 40. This conical flow of the atomized liquid material containing mist and vapor then collides with the surface set at, e.g., 150° C. of the heat-exchange lower block 31. Consequently, the flow of the atomized liquid material is expanded by the heat-exchange lower block 31 that enters the center of the flow, and then is guided into the annular space F formed between the inner surface of the container 40 and the heat-exchange lower block 31. Around this space, the atomized liquid material is directly heated by radiant heat from the internal heater 33 inside the heat-exchange lower block 31, thereby making progress of vaporization.

As described above, the annular space F is arranged such that the width on the output port 32 side is smaller than the width on the side opposite thereto. In this case, even where a negative pressure is generated at the output port 32 due to a sucking force through the supply line 53, the pressure difference in the annular space F between the output port 32 side and the opposite side is small, and the pressure inside the annular space F can be thereby almost uniform. Consequently, the atomized liquid material, which has been partly vaporized in the run-up space G, is heated in the annular space F while it is uniformly flowing therethrough. This makes it possible to efficiently vaporize the atomized liquid material to generate the process gas.

Further, the heat-exchange lower block 31 has an almost uniform temperature over the upper surface (near the temperature sensor 35) and the side surface. Accordingly, the process gas can flow toward the supply line 53 while suppressing thermal decomposition thereof (in a state containing essentially no decomposition products). The heat-exchange lower block 31 is prevented from being overheated, so the O-rings 49b and 51b described above do not exceed their heat-resistant temperature. Hence, the O-rings 49b and 51b are not thermally degraded.

The process gas flowing downward in the annular space F can change direction to the horizontal direction by a sucking force through the output port 32, and flow into the supply line 53. On the other hand, the mist mixed within the process gas does not change direction, but flows downward due to an inertia force based on its own large weight. Consequently, the mist is separated from the process gas and reaches the bottom of the container 40. The mist is accumulated and agglomerated to change into a liquid phase at the bottom of the container 40, and then flows toward the drain port 34 (the valve Vm is set closed). Since the drain port 34 is formed at a position lower than the output port 32, no drainage liquid flows into the output port 32.

If the heat-exchange lower block 31 is disposed at the center of the container 30, the pressure difference in the annular space F between the output port 32 side and the opposite side becomes larger due to a sucking force through the output port 32, and the pressure inside the annular space F can be thereby less uniform. In this case, the atomized liquid material cannot uniformly flow through the annular space F, thereby decreasing the vaporization efficiency. Although the present invention covers such a case, but the heat-exchange lower block 31 is preferably offset toward the output port 32 side.

The process gas thus generated by vaporization of the hafnium-containing material is supplied through the supply line 53 into the film formation section 100. The process gas through the supply line 53 is supplied along with oxygen gas (not shown) into the reaction tube 110 stabilized at a predetermined temperature and a predetermined pressure. Under these conditions, a film formation process is performed to form a hafnium oxide film on the wafers W.

After the process gas is supplied into the film formation section 100 for a predetermined time, the process gas is stopped, and the electric power applied to the internal heater 33 is stopped or decreased. Specifically, the valves V1, V2, V3, and Va are set closed, and the output of the power supply section 50a is stopped or decreased. Further, the valves Vb and Vm are set open to perform a purge process inside the vaporizer 2. Consequently, $N_2$ gas used as a purge gas is supplied from the gas supply source 24 through the gas supply line 23 at a flow rate controlled by the mass flow controller M1 into the vaporizer 2, and then is exhausted from the discharge line 42.

Figure 4:
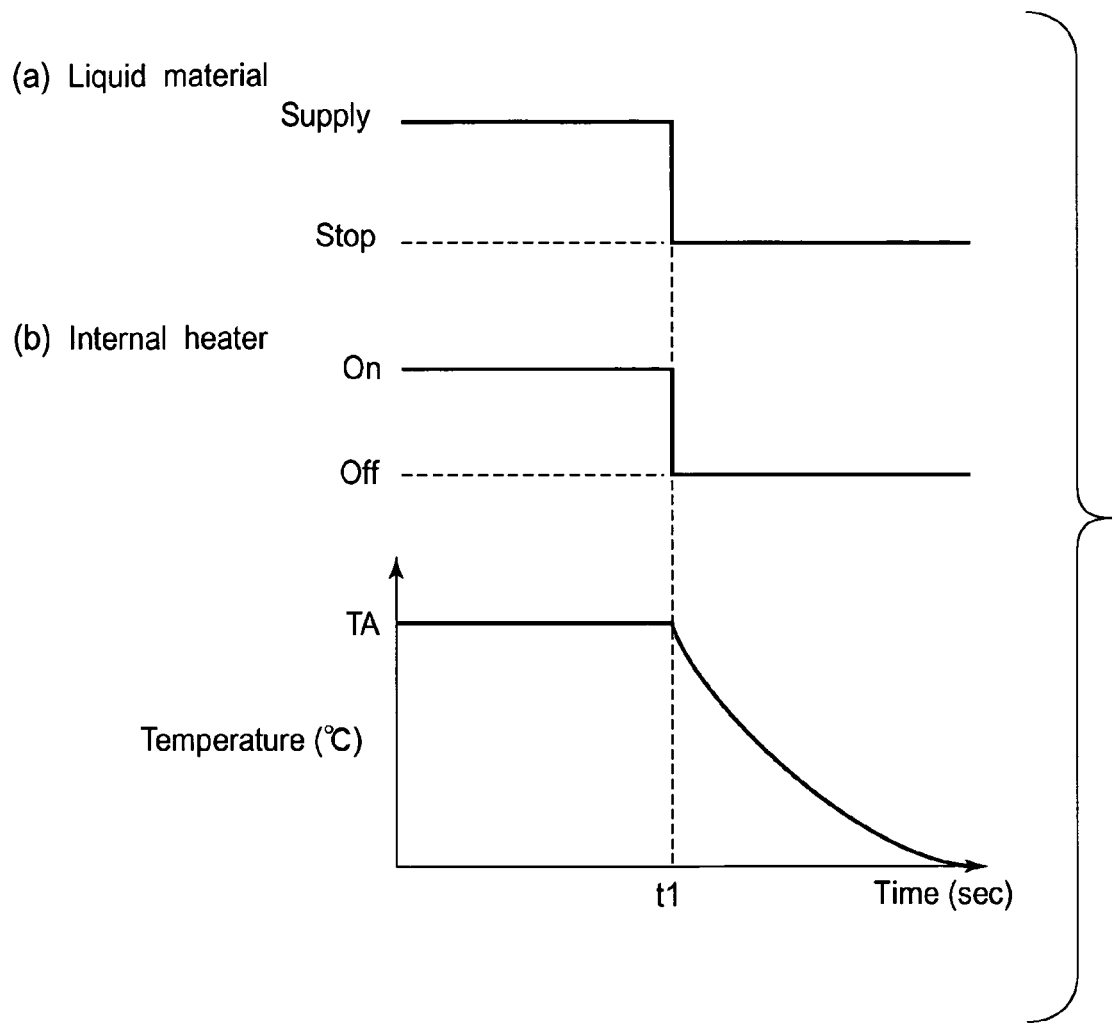
FIG. 4 is a characteristic diagram schematically showing a change in the temperature at the top of the heat-exchange lower block of the vaporizer shown in FIG. 2 when supply of the liquid material is stopped.

FIG. 4 is a characteristic diagram schematically showing a change in the temperature at the top of the heat-exchange lower block 31 of the vaporizer 2 shown in FIG. 2 when supply of the liquid material is stopped. As shown in FIG. 4, at a time point t1, supply of the process gas is stopped, supply of the liquid material is stopped, and supply of the electric power to the internal heater 33 inside the heat-exchange lower block 31 is stopped. As described above, the heat-exchange lower block 31 is hollow and has a small thermal capacity, and thus the heat stored therein is very small at this time. Accordingly, the heat-exchange lower block 31 is swiftly cooled from a temperature TA at the time point t1, and thus mist of the liquid material inside the vaporizer 2 is not decomposed by overheat, but can be discharged through the discharge line 42.

After the film formation process, the interior of the vaporizer 2 is purged with nitrogen gas, so that the residual part of the liquid material is completely removed from inside the vaporizer 2. Further, the purge gas may be supplied into the supply line 53. In this case, the valve Vf is set open, and nitrogen gas is supplied from the nitrogen gas supply source 25 into the film formation section 100. Under these conditions, deposited substances on the inner wall of the supply line 53, such as residual substances of the process gas and solid components formed by denaturing of the process gas, are pushed away into the film formation section 100, and are removed from the reaction tube 110 into the exhaust line 140.

After the film formation process is repeated a predetermined number of times, a cleaning process of the vaporizer 2 is performed, as follows. Specifically, the exhaust pump 44 is operated while the valves V1, V2, V3, Va, Vb, Vd, and Ve are set closed, and the valves Vc and Vm are set open. Under these conditions, the mist stored in the container 40 is discharged from inside the container 40 through the discharge line 42, while the cleaning solution is supplied into the vaporizer 2 through the supply line 61. Since the cleaning solution is a solvent that dissolves the liquid material and solidified liquid material, mist deposited on the inner wall of the container 40 of the vaporizer 2 is washed away. Further, even if mist has partly condensed or denatured to solid components, they are dissolved by the cleaning solution and removed.

In the cleaning process, the exhaust pump 44 may be operated while the valves V2, Vd, and Ve are set open. Under these conditions, the cleaning solution is caused to flow through the branch line 63, liquid mass flow meter M, supply line 51, branch line 54, and discharge line 42, so as to remove deposited substances on the inner walls of these members, such as the liquid material and solidified components of the liquid material.

As described above, the vaporizer 2 includes the heat-exchange lower block 31 disposed below the run-up space G to form the annular space F around it, so that the atomized liquid material can be vaporized with high efficiency. The heat-exchange lower block 31 is formed of the hollow casing 31a that has a small wall thickness with a small thermal capacity and the internal heater 33 disposed as a radiant heat source inside the casing 31a. Accordingly, the entire surface of the heat-exchange lower block 31 is uniformly heated without temperature variations. Further, the temperature of the heat-exchange lower block is prevented from causing overshoot when supply of the liquid material is stopped. Consequently, the liquid material is less thermally decomposed, thereby suppressing particle generation. In this case, the flow rate of the process gas can be set higher (the amount of vaporized liquid material to be larger).

Figure 5:
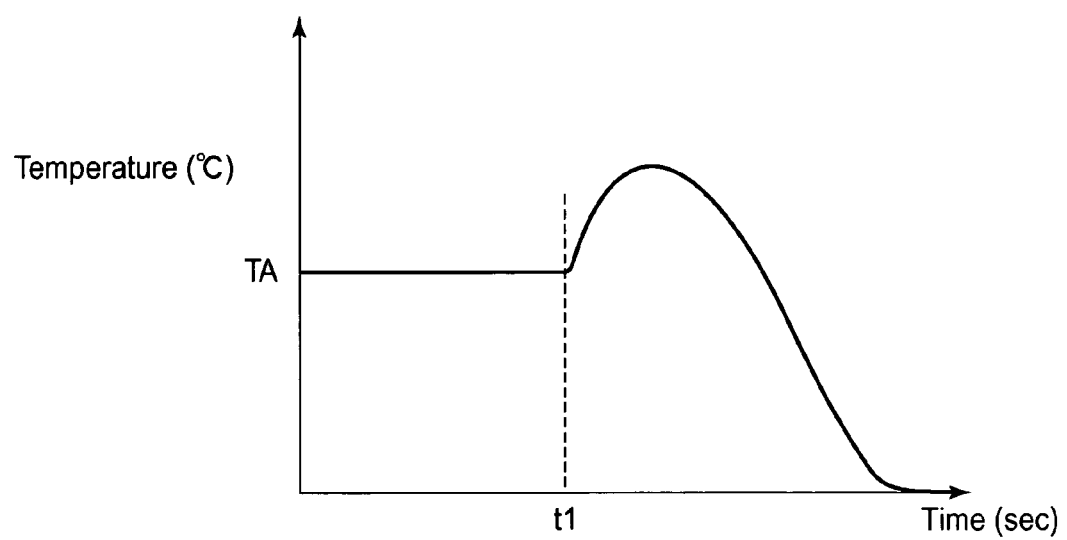
FIG. 5 is a characteristic diagram schematically showing a change in the temperature at the top of the heat-exchange lower block of the vaporizer shown in FIG. 6 when supply of the liquid material is stopped.

FIG. 5 is a characteristic diagram schematically showing a change in the temperature at the top of the heat-exchange lower block 303 of the vaporizer 300 shown in FIG. 6 when supply of the liquid material is stopped. In the case of the vaporizer 300 shown in FIG. 6, the heat-exchange lower block 303 has a solid-core structure, so the internal temperature thereof becomes higher than the surface temperature, and may reach, e.g., 350° C. When supply of the process gas is stopped (vaporization of the liquid material is stopped) at a time point t1, the heat-exchange lower block 303 loses the target for heat discharge (cooling source). Consequently, the internal heat is rapidly spread all over the heat-exchange lower block 303, and lapses into a so-called overshoot state, as shown in FIG. 5. At this time, the surface temperature of the heat-exchange lower block 303 is increased from a temperature TA at the time point t1 to about 300° C., and causes decomposition of the liquid material, as described above.

Further, in the case of the vaporizer 2 according to this embodiment, the casing 31a of the heat-exchange lower block 31 is made of a material, such as quartz, that transmits radiant heat from the internal heater 33. In this case, the internal heater 33 directly heats not only the surface of the heat-exchange lower block 31, but also the inner wall of the container 40 and mist of the liquid material flowing through the inside of the container 40 (the annular space F and run-up space G). Accordingly, the amount of liquid material vaporized is increased, while the amount of mist supplied to film formation section 100 is decreased, so that particle generation is suppressed. Since the area heated by the internal heater 33 is larger, the heaters 48 of the container 40 may be omitted or the set temperature of the heaters 48 may be lowered.

Further, the interior of the casing 31a is hollow, so that the thermal capacity of the heat-exchange lower block 31 is further decreased. In this case, the casing 31a contains few substances that conduct heat, and the heat of the internal heater 33 is less used by heat conduction. Further, hardly any heated gas can be moved by convection in the vertical direction inside the casing 31a, so the temperature difference on the heat-exchange lower block 31 is small in the vertical direction. In addition, the casing 31a is heated by radiant heat from the internal heater 33, so the casing 31a is uniformly heated, as a whole. Consequently, the heat-exchange lower block 31 is prevented from being locally overheated, and the O-rings 49b and 51b are not thermally degraded.

Further, the atomized liquid material is delivered downward from the injector 30, and is then further uniformly atomized and partly vaporized by heating in the run-up space G. Subsequently, the atomized liquid material is expanded by the heat-exchange lower block 31, and then flows through the annular space F while it is heated by a sufficient heat exchange. Since the annular space F entails no gas dead volumes, the atomized liquid material can be reliably vaporized with high efficiency. With this arrangement, the process gas (vaporized liquid material) containing the least mist can be supplied into the film formation section 100, so particles are prevented from being deposited on the wafers.

In the embodiment described above, the vaporizer container 40 is provided with the heaters 48 disposed around it. However, as described above, the internal heater 33 inside the heat-exchange lower block 31 serves as a heater for the inner wall of the container 40 as well. Accordingly, where the internal heater 33 can sufficiently vaporize the liquid material, the heaters 48 may be omitted or the set temperature of the heaters 48 may be lowered (by, e.g., using an inexpensive heater with a smaller output).

In the embodiment described above, the heat-exchange lower block 31 has an essentially circular shape in the sectional plan view, but it may have a polygonal shape. As a hafnium-containing liquid material having a low vapor pressure, TDEAH ($HF[N(C_2H_5)]_4$), which has a vapor pressure of 40 Pa or less at 120° C., may be used. Other than a hafnium-containing material, $Ta(OC_2H_5)_5$, which has a vapor pressure of 40 Pa or less at 140° C., may be used. Further, the present invention may be applied to a process using a process gas generated by vaporizing HEAD (hexamethylaminodisilane) along with $NH_3$ gas to form a silicon nitride film, a process using a process gas generated by vaporizing $Ta(OC_2H_5)_5$ along with $O_3$ gas to form a $Ta_2O_5$ film, and a process using supply of water vapor. The film formation section may employ a film formation apparatus of the single-substrate type other than a low-pressure CVD apparatus of the batch type.

Further, the embodiment described above employs only one storage vessel 1 that stores a liquid material, but this is not limiting. For example, a plurality of storage vessels that respectively store different liquid materials may be employed and connected to the respective vaporizers for vaporizing the liquid materials. In this case, a plurality of process gases generated by the respective vaporizers are supplied into the reaction tube 110 of the film formation section 100 to perform a film formation process. For example, such a supply system may be applied to a film formation process for a metal oxide film with a high dielectric constant, such as BST (barium strontium titanium) oxide film containing barium (Ba), strontium (Sr), and titanium (Ti).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vaporizer for generating a process gas from a liquid material, the vaporizer comprising:
   a container defining a process space of the vaporizer;
   an injector having a spray port configured to spray the liquid material in an atomized state downward in the container;
   a heat-exchange lower block having an internal space and disposed below the spray port inside the container such that a run-up space for the atomized liquid material is defined between the spray port and the heat-exchange lower block, and an annular space continuous to the run-up space is defined between an inner surface of the container and the heat-exchange lower block, the heat-exchange lower block being a column having a circular or polygonal shape in cross section and configured to guide the atomized liquid material, which is flowing downward from the injector through the run-up space, into the annular space without allowing the atomized liquid material to flow into the heat-exchange lower block;

an internal heater disposed in the internal space of the heat-exchange lower block and connected to a power supply disposed outside the container, the internal heater being configured to heat the atomized liquid material flowing through the annular space to generate the process gas;

a gas delivery passage connected to the container to output the process gas from the annular space; and a control section preset to stop or decrease electric power supplied from the power supply to the internal heater when supply of the liquid material from the injector is stopped, wherein the column, serving as the heat-exchange lower block, is formed of an airtight casing having a wall thickness of 1 to 10 mm and has a thermal capacity decreased by being hollow, the internal space is defined by the casing and has atmospheric pressure or a vacuum pressure, and the casing is transparent to transmit infrared rays, and wherein the internal heater includes a carbon wire formed of woven bundles of carbon fibers and sealed in a ceramic envelope, the internal heater is disposed in the internal space to heat the casing from inside mainly by radiant heat, and the internal heater heats the container from inside through the transparent casing by radiant heat.

2. The vaporizer according to claim 1, wherein the internal space of the heat-exchange lower block is filled with an inactive gas.

3. The vaporizer according to claim 1, wherein the vaporizer further comprises a temperature sensor disposed in the internal space of the heat-exchange lower block, and the control section is preset to control the electric power supplied to the internal heater in accordance with temperatures detected by the temperature sensor and a preset temperature.

4. The vaporizer according to claim 1, wherein the temperature sensor is configured to detect temperature at a top of the heat-exchange lower block.

5. The vaporizer according to claim 1, wherein the vaporizer further comprises a surrounding heater provided to the container to heat the process space of the vaporizer.

6. The vaporizer according to claim 1, wherein the gas delivery passage is configured to laterally output the process gas from the annular space, and the annular space is formed such that a first width on a side connected to the gas delivery passage is smaller than a second width on a side opposite thereto.

7. The vaporizer according to claim 1, wherein the injector has a double tube structure formed of inner and outer tubes and configured to supply the liquid material from the inner tube and to supply an atomizing gas from the outer tube.

8. The vaporizer according to claim 1, wherein the ceramic envelope is made of transparent quartz.

9. The vaporizer according to claim 8, wherein the casing is made of transparent quartz and the wall thickness is 2 to 6 mm.

10. A semiconductor processing system comprising:
a process chamber configured to accommodate a target substrate;
a support member configured to support the target substrate inside the process chamber;
a heater configured to heat the target substrate inside the process chamber;
an exhaust system configured to exhaust gas from inside the process chamber; and
a gas supply system configured to supply a process gas into the process chamber, and including a vaporizer for generating the process gas from a liquid material,
wherein the vaporizer includes
a container defining a process space of the vaporizer,
an injector having a spray port configured to spray the liquid material in an atomized state downward in the container,
a heat-exchange lower block having an internal space and disposed below the spray port inside the container such that a run-up space for the atomized liquid material is defined between the spray port and the heat-exchange lower block, and an annular space continuous to the run-up space is defined between an inner surface of the container and the heat- exchange lower block, the heat-exchange lower block being a column having a circular or polygonal shape in cross section and configured to guide the atomized liquid material, which is flowing downward from the injector through the run-up space, into the annular space without allowing the atomized liquid material to flow into the heat-exchange lower block,
an internal heater disposed in the internal space of the heat-exchange lower block and connected to a power supply disposed outside the container, the internal heater being configured to heat the atomized liquid material flowing through the annular space to generate the process gas,
a gas delivery passage connected to the container to output the process gas from the annular space, and
a control section preset to stop or decrease electric power supplied from the power supply to the internal heater when supply of the liquid material from the injector is stopped,
wherein the column, serving as the heat-exchange lower block, is formed of an airtight casing having a wall thickness of 1 to 10 mm and has a thermal capacity decreased by being hollow, the internal space is defined by the casing and has atmospheric pressure or a vacuum pressure, and the casing is transparent to transmit infrared rays, and
wherein the internal heater includes a carbon wire formed of woven bundles of carbon fibers and sealed in a ceramic envelope, the internal heater is disposed in the internal space to heat the casing from inside mainly by radiant heat, and the internal heater heats the container from inside through the transparent casing by radiant heat.

11. The system according to claim 10, wherein the internal space of the heat-exchange lower block is filled with an inactive gas.

12. The system according to claim 10, wherein the vaporizer further comprises a temperature sensor disposed in the internal space of the heat-exchange lower block, and the control section is preset to control the electric power supplied to the internal heater in accordance with temperatures detected by the temperature sensor and a preset temperature.

13. The system according to claim 10, wherein the temperature sensor is configured to detect temperature at a top of the heat-exchange lower block.

14. The system according to claim 10, wherein the vaporizer further comprises a surrounding heater provided to the container to heat the process space of the vaporizer.

15. The system according to claim 10, wherein the gas delivery passage is configured to laterally output the process gas from the annular space, and the annular space is formed such that a first width on a side connected to the gas delivery passage is smaller than a second width on a side opposite thereto.

16. The system according to claim 10, wherein the gas supply system further comprises a storage vessel that stores the liquid material and is connected to the vaporizer through a liquid material supply passage, and a gas supply section configured to supply a pressurized gas to the storage vessel, so as to send the liquid material by pressure from the storage vessel to the vaporizer through the liquid material supply passage.

17. The system according to claim 10, wherein the gas supply system is configured to supply, as the process gas, a gas for forming a thin film on the target substrate by CVD.

18. The system according to claim 10, wherein the ceramic envelope is made of transparent quartz.

19. The system according to claim 18, wherein the casing is made of transparent quartz and the wall thickness is 2 to 6 mm.

* * * * *